United States Patent
Makino et al.

(10) Patent No.: US 9,066,423 B2
(45) Date of Patent: Jun. 23, 2015

(54) ELECTRICAL JUNCTION BOX

(71) Applicant: Yazaki Corporation, Tokyo (JP)

(72) Inventors: Masahiro Makino, Makinohara (JP); Takanori Kawai, Miyoshi (JP); Yoshiyuki Ishihara, Toyota (JP)

(73) Assignee: Yazaki Corporation, Tokyo (JP)

( * ) Notice: Subject to any disclaimer, the term of this patent is extended or adjusted under 35 U.S.C. 154(b) by 244 days.

(21) Appl. No.: 13/911,276

(22) Filed: Jun. 6, 2013

(65) Prior Publication Data

US 2013/0335889 A1      Dec. 19, 2013

(30) Foreign Application Priority Data

Jun. 7, 2012   (JP) .................................. 2012-129831

(51) Int. Cl.
| | |
|---|---|
| *H02B 1/26* | (2006.01) |
| *H01R 12/00* | (2006.01) |
| *H02G 3/08* | (2006.01) |
| *H05K 5/02* | (2006.01) |

(52) U.S. Cl.
CPC .............. *H05K 5/0239* (2013.01); *H02G 3/088* (2013.01)

(58) Field of Classification Search
CPC combination set(s) only.
See application file for complete search history.

(56) References Cited

U.S. PATENT DOCUMENTS

| 7,253,356 | B2* | 8/2007 | Kiyota et al. ............. 174/17 VA |
| 7,459,630 | B2* | 12/2008 | Pinol Pedret et al. ........... 174/50 |
| 7,775,807 | B2* | 8/2010 | Yamaguchi et al. ......... 439/76.2 |
| 8,157,116 | B2* | 4/2012 | Ejima ............................ 220/3.2 |
| 8,420,931 | B2* | 4/2013 | Soh et al. ........................ 174/50 |
| 2006/0260834 | A1* | 11/2006 | Kanazawa et al. ............... 174/50 |
| 2008/0083547 | A1* | 4/2008 | Pinol Pedret et al. ........... 174/50 |
| 2009/0163053 | A1* | 6/2009 | Yamaguchi et al. ......... 439/76.1 |

FOREIGN PATENT DOCUMENTS

JP          8322124 A      12/1996

* cited by examiner

*Primary Examiner* — Gregory Thompson
(74) *Attorney, Agent, or Firm* — Sughrue Mion, PLLC

(57) ABSTRACT

An electrical junction box includes a box body in which electrical parts are mounted and that has a water draining hole provided at a bottom wall part of the box body and a waterproof wall that is provided inside the box body along a periphery of an opening of the water draining hole. The waterproof wall includes a spherical cover wall part standing from the periphery of the water draining hole to cover the water draining hole with an inner spherical surface, and a draining opening part formed at a portion of the spherical cover wall part to allow water exist in the box body to drain to the outside of the box body through the water draining hole.

5 Claims, 10 Drawing Sheets

ELECTRICAL JUNCTION BOX

CROSS REFERENCE TO RELATED APPLICATION

This application is based on Japanese Patent Applications No. 2012-129831 filed on Jun. 7, 2012, the contents of which are incorporated herein by reference.

BACKGROUND OF THE INVENTION

1. Technical Field

The invention relates, in general, to an electrical junction box having a water draining hole on a bottom wall part of a box body in which electrical parts are contained.

2. Background Art

Conventionally, an electrical junction box, in which electrical parts such as connectors, relays, fuses, or the like are intensively integrated, is mounted in an engine room to supply electric power to electronic appliances mounted e.g. in a vehicle. Proposed has been an electrical junction box in which a water draining hole is formed on a bottom wall part of a box body thereof to prevent the infiltration of water into the box body in which electrical parts are mounted (see e.g. JP-A-08-322124).

The electrical junction box disclosed in the JP-A-08-322124 includes vertical waterproof walls which protrude towards the inside of a lower cover section from the periphery of a water draining hole of the lower cover section, except a partial edge of the periphery, a lateral waterproof wall which is connected to the tips of the vertical waterproof walls and faces the water draining hole, and a downward water draining wall which protrudes downwards from the tip of the lateral waterproof wall toward the water draining hole. Thus, the configuration prevents pressurized washing water from infiltrating into the lower cover section through the water draining hole.

The electrical junction box disclosed in JP-A-08-322124 has a problem in that water may bounce against the waterproof walls, which are provided inside the water draining hole along the periphery thereof, and infiltrate into the electrical junction box as a result.

The present invention has been made keeping in mind the above problems, and an object of the present invention is to provide an electrical junction box capable of preventing water bouncing against waterproof walls, which are provided inside a water draining hole along the periphery thereof, from infiltrating into the junction box.

SUMMARY OF THE INVENTION (1) According to an aspect of the invention, an electrical junction box includes a box body in which electrical parts are mounted and that has a water draining hole provided at a bottom wall part of the box body and a waterproof wall that is provided inside the box body along a periphery of an opening of the water draining hole. The waterproof wall includes a spherical cover wall part standing from the periphery of the water draining hole to cover the water draining hole with an inner spherical surface, and a draining opening part formed at a portion of the spherical cover wall part to allow water exist in the box body to drain to the outside of the box body through the water draining hole.

(2) In the electrical junction box of (1), the box body includes a peripheral draining protrusion having a shape of a cylinder protruding from an outer surface of the box body along the periphery of the water draining hole and serving as a draining passage.

(3) In the electrical junction box of (1) or (2), an upper periphery of the draining opening part is located below the top of the inner spherical surface.

(4) In the electrical junction box of any one of (1) to (3), the opening of the water draining hole is formed in a shape of the letter D, and the peripheral draining protrusion has an outer surface defined by a flat surface part and a curved surface part so as to correspond to the shape of the water draining hole.

(5) In the electrical junction box of any one of (1) to (4), the spherical cover wall part is formed as a dome-type wall having a spherical surface.

According to the electrical junction box of (1) of the invention, with the configuration of the spherical cover wall part covering the water draining hole in a spherical form from the inside of the electrical junction box, the whole of the inner spherical surface thereof faces the water draining hole, so pressurized water infiltrating into the water draining hole from the outside bounces back against the spherical surface towards the water draining hole. Therefore, water bouncing against the waterproof wall, which is provided inside the water draining hole along the periphery thereof, is restricted from infiltrating into the water draining hole.

According to the electrical junction box of (2) of the invention, with the configuration of the peripheral draining protrusion around the periphery of the water draining hole, water is restricted from infiltrating into the water draining hole.

According to the electrical junction box of (3) of the invention, with the configuration of the downwardly protruding portion of the spherical cover wall part forming the upper periphery of the draining opening part formed at the spherical cover wall part, water infiltrating into the box body through the draining opening part formed at the spherical cover wall part bounces against the downwardly protruding portion of the spherical cover wall part and thus is restricted from infiltrating into the box body.

According to the electrical junction box of (4) of the invention, with the curved surface part of the peripheral draining protrusion, it is difficult for water bouncing against the curved surface part to stay around the curved surface part, thereby preventing the water from infiltrating into the water draining hole.

According to the electrical junction box of (5) of the invention, with the configuration of the outer spherical surface of the spherical cover wall part facing the inside of the box body, water provided inside the box body comes into smooth contact with the spherical cover wall part and thus is difficult to stay around the spherical cover wall part, thereby facilitating the drainage of the water in the box body towards the outside through the water draining hole.

DESCRIPTION OF EMBODIMENTS

An illustrative embodiment of an electrical junction box will now be described in detail with reference to the accompanying drawings.

Figure 1A:
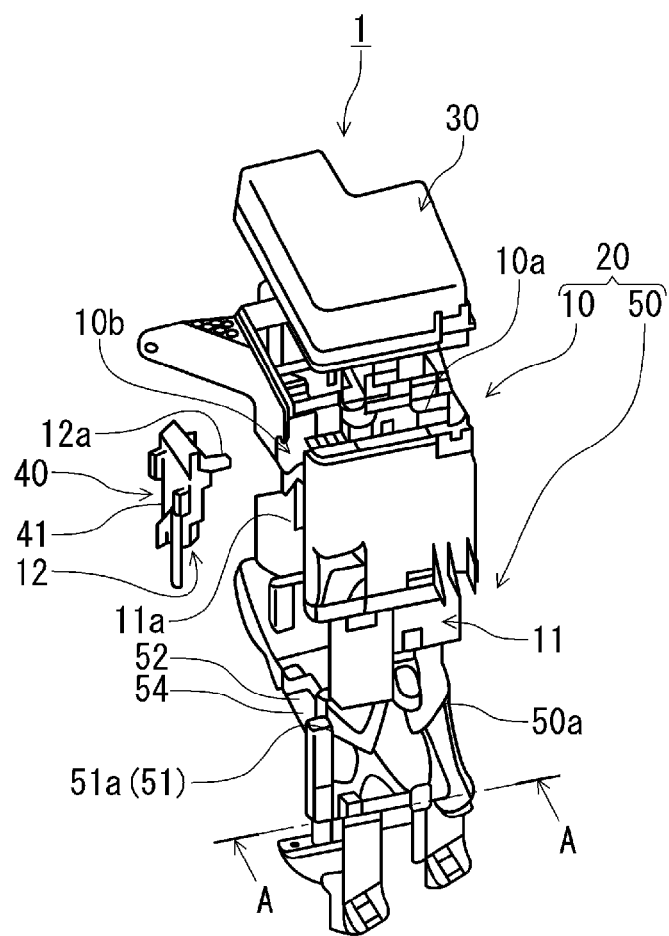
FIGS. 1A and 1B respectively are an exploded perspective view of an electrical junction box according to an illustrative embodiment of the present invention and a sectional view taken along line A-A of FIG. 1A.
Figure 1B:
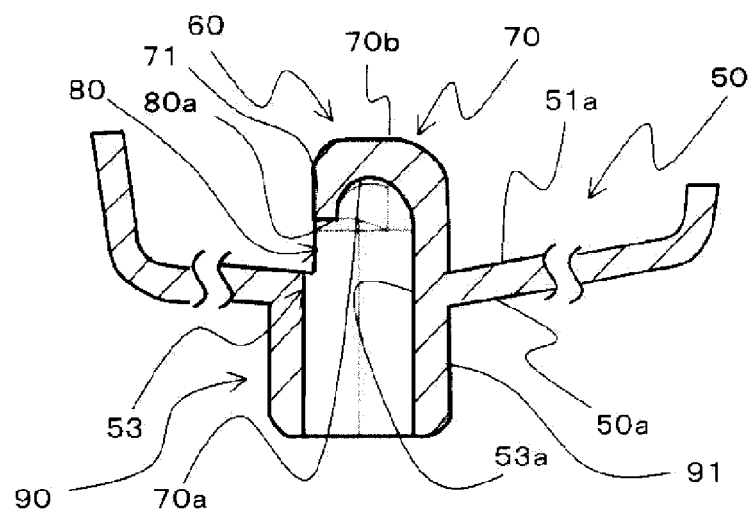
Figure 2:
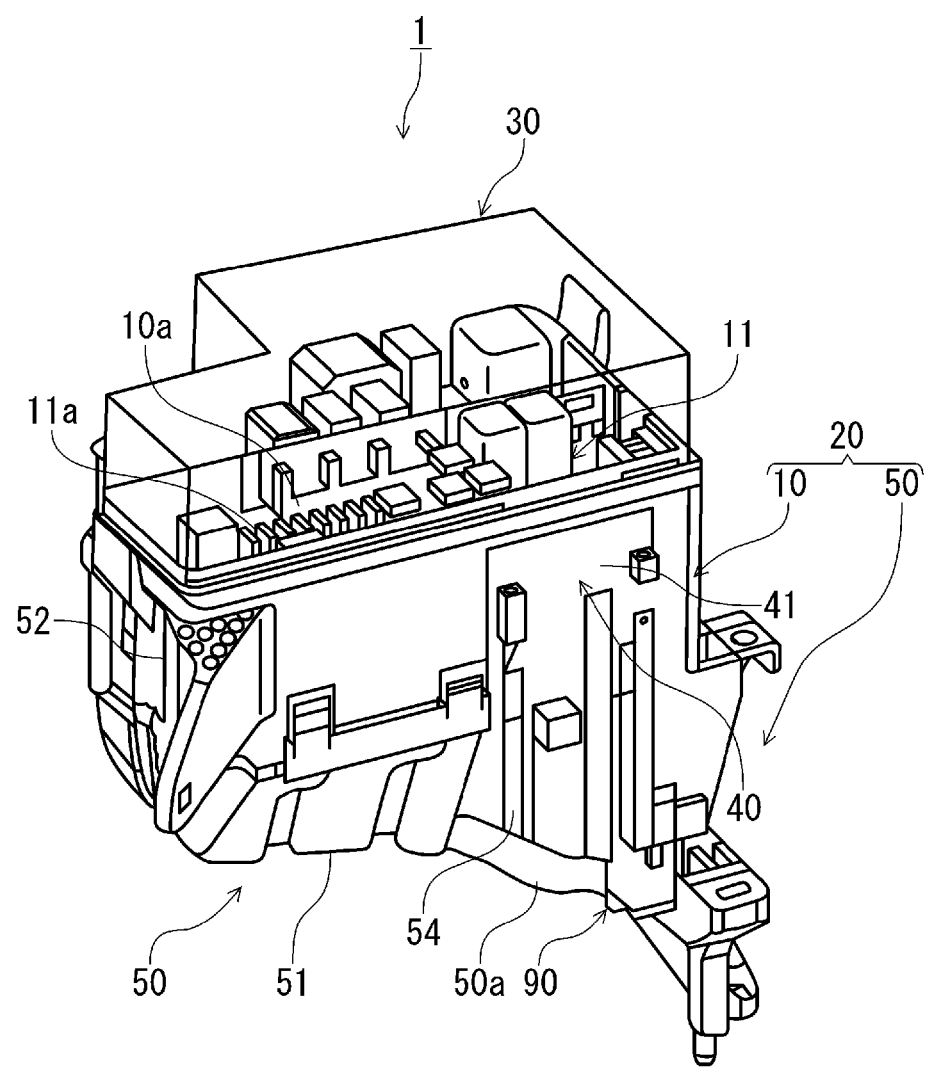
FIG. 2 is a perspective view of the electrical junction box shown in FIG. 1.

FIGS. 1A and 1B respectively are an exploded perspective view of an electrical junction box 1 according to an illustrative embodiment of the present invention and a sectional view taken along line A-A of FIG. 1A. FIG. 2 is a perspective view of the electrical junction box 1 shown in FIGS. 1A and 1B.

Here, FIG. 2 shows the inside of the electrical junction box by penetrating an upper cover section 30.

Figure 3:
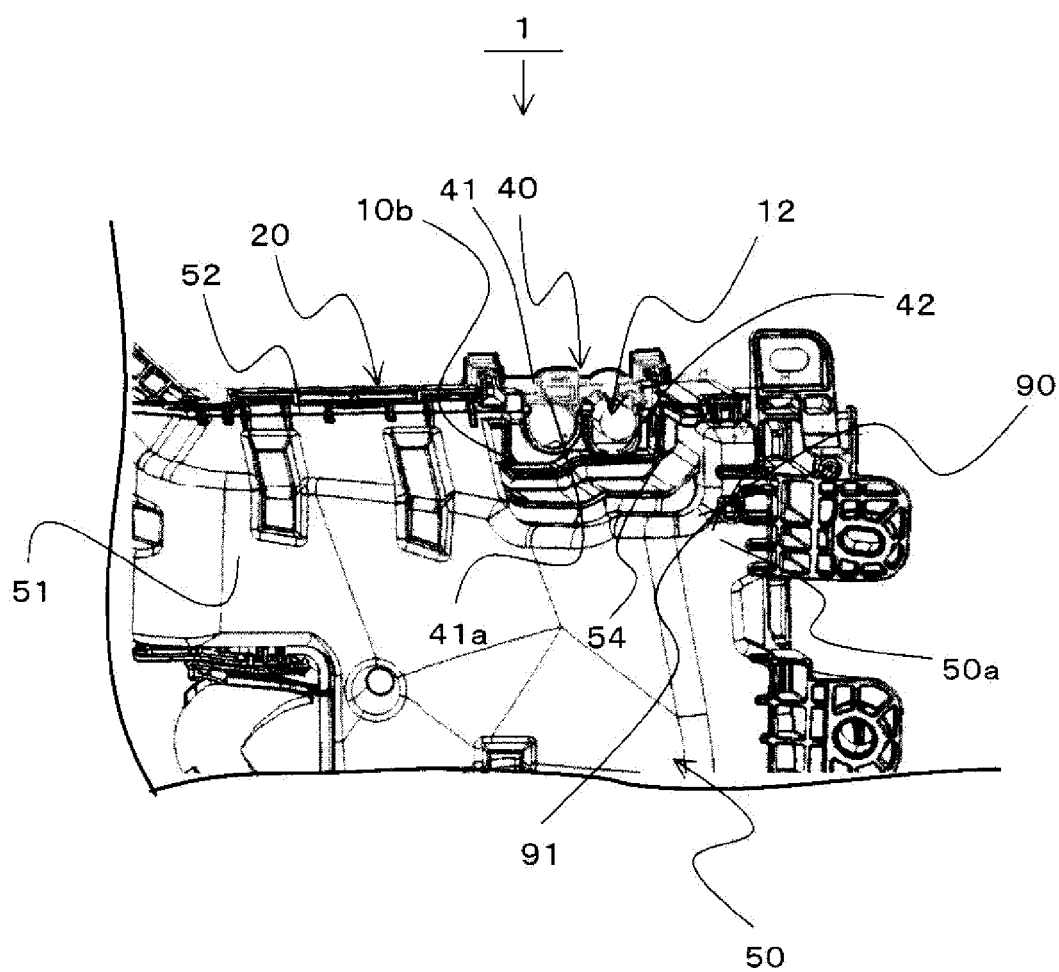
FIG. 3 is a view of the surroundings of a side cover section shown in FIG. 2 when viewed from a lower side thereof.
Figure 4:
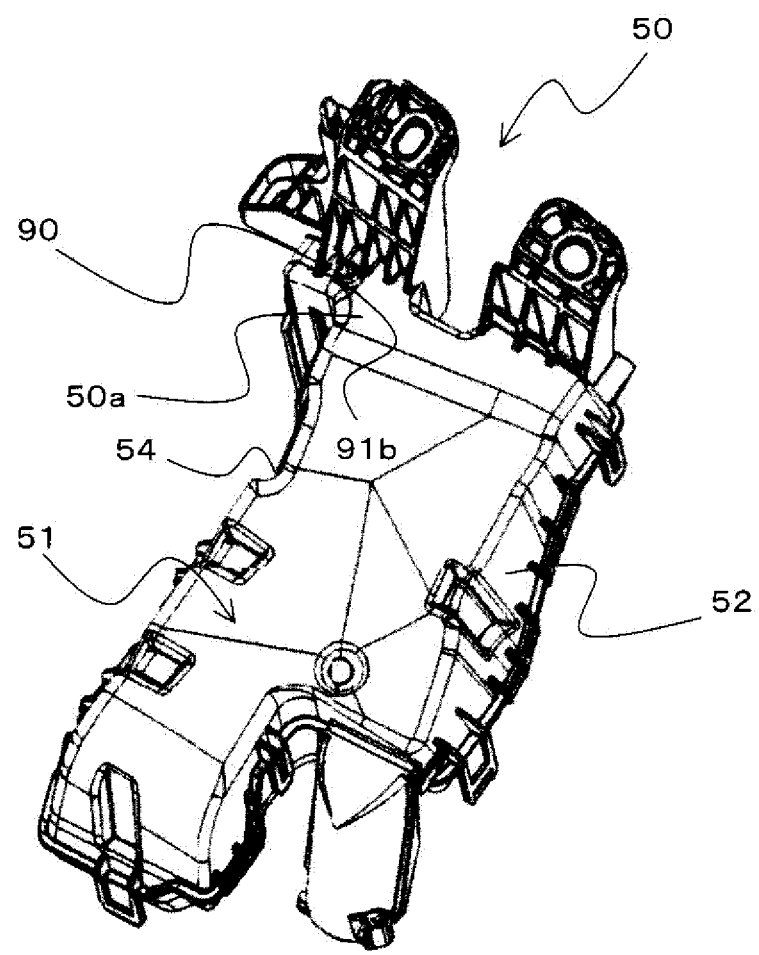
FIG. 4 is a view of a lower cover section when obliquely viewed from a lower side thereof.
Figure 5:
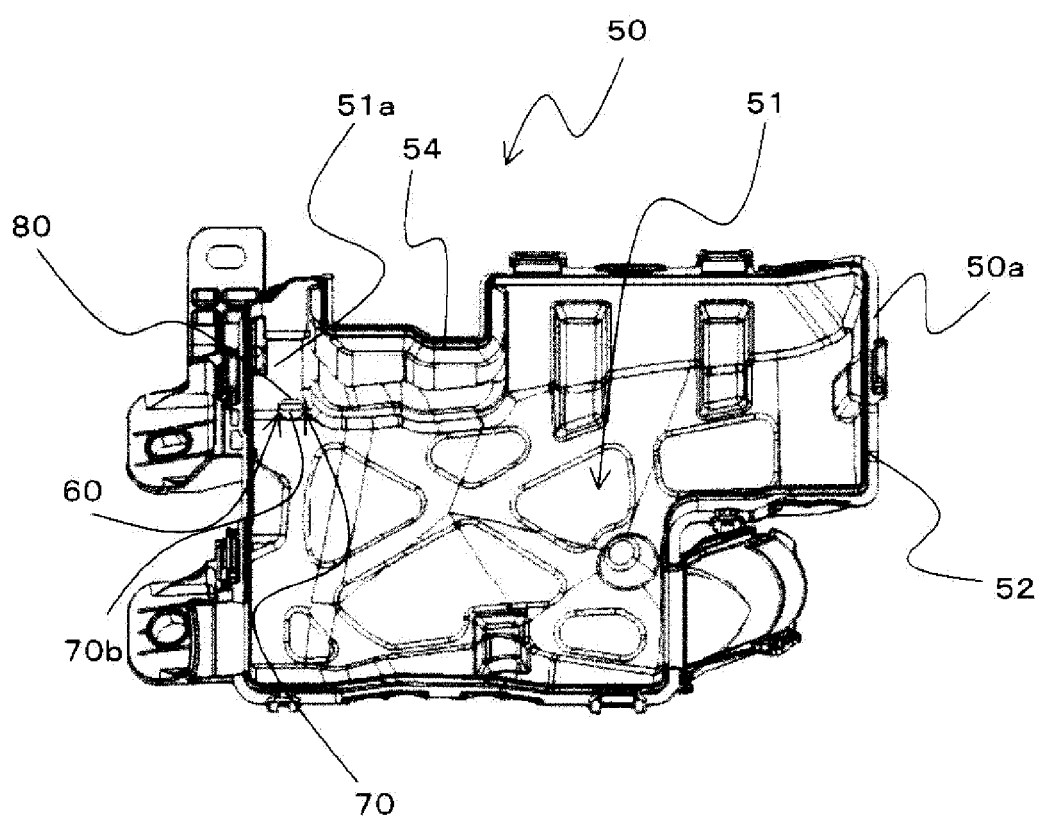
FIG. 5 is a view of the lower cover section when viewed from an upper opening thereof.
Figure 6:
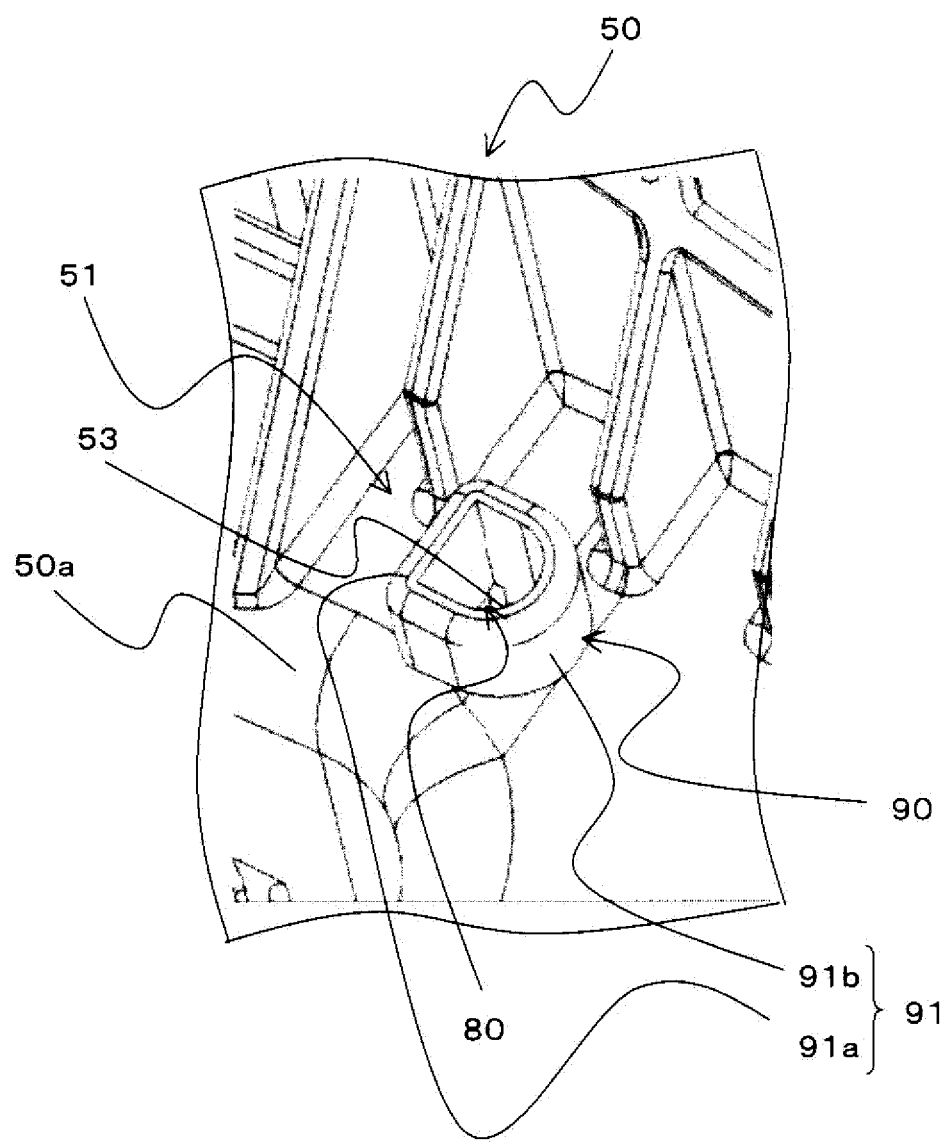
FIG. 6 is a perspective view of the surroundings of a peripheral draining protrusion when obliquely viewed from a lower side thereof.
Figure 7:
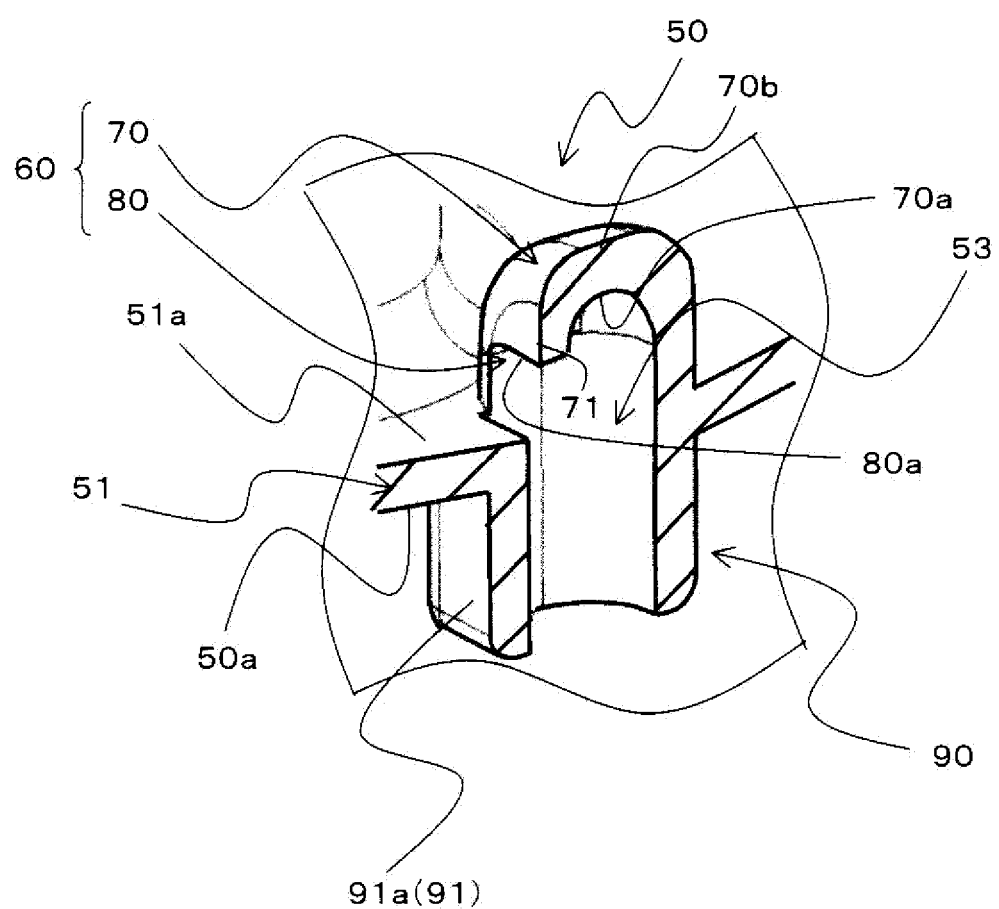
FIG. 7 is a sectional view of the major surroundings of a water draining hole when obliquely viewed from an upper portion of the inside of the lower cover section.
Figure 8:
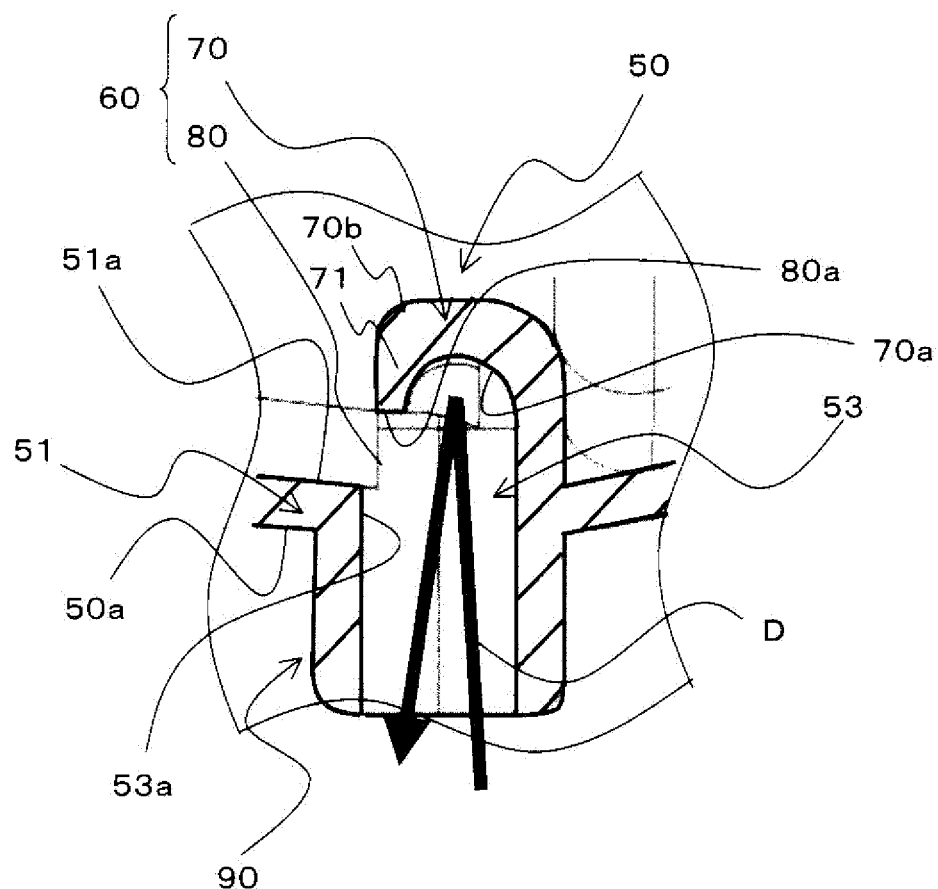
FIG. 8 is a view showing water bouncing back against an inner spherical surface of a spherical cover wall part shown in FIG. 1 towards the water draining hole.

FIG. 3 is a view of the surroundings of a side cover section 40 shown in FIG. 2 when viewed from a lower side thereof. FIG. 4 is a view of a lower cover section 50 when obliquely viewed from a lower side thereof. FIG. 5 is a view of the lower cover section 50 when viewed from an upper opening thereof. FIG. 6 is a perspective view of the surroundings of a peripheral draining protrusion 90 when obliquely viewed from a lower side thereof. FIG. 7 is a sectional view of the major surroundings of a water draining hole 53 when obliquely viewed from an upper portion of the inside of the lower cover section 50. FIG. 8 is a view showing water bouncing back against an inner spherical surface 70a of a spherical cover wall part 70 shown in FIG. 1 towards the water draining hole 53.

Here, the arrow D shown in FIG. 8 indicates the direction of water that bounces against the spherical surface of the spherical cover wall part 70. The electrical junction box 1 according to an illustrative embodiment of the invention includes a box body 20 in which electrical parts 11a such as connectors, relays, fuses, etc. are contained, an upper cover section 30 which covers an upper portion of the box body 20, and a side cover section 40 which is attached to the box body 20 to shield a groove part 10b on the box body in which a connector 12a of an electrical connection member 12 is accommodated.

The box body 20 will now be described.

The box body 20 is made of electrically insulating synthetic resin, and includes a frame section 10 and a lower cover section 50.

The lower cover section 50 covers a lower portion of the frame section and forms a bottom wall part 51a of the box body 20.

The frame section 10 has an outer contour that is defined by a barrel type outer wall. The frame section has a partition wall 10a which allows a cassette block 11, in which electrical parts 11a are mounted, to be dividedly accommodated in the frame section.

The frame section 10 has, on the outer surface thereof, a groove part 10b which extends linearly from an upper end to a lower end thereof and in which the connector 12a of the electrical connection member 12 is accommodated.

As shown in FIG. 1, the electrical connection member 12 is an electric wire having a terminal, i.e., the connector 12a. The connector 12a is accommodated in the groove part 10b on the box body. One end of the electrical connection member is connected to the electrical part 11a which is mounted in the cassette block 11 in the electrical junction box 1, and the other end of the electrical connection member is drawn from a groove part 54 on the lower cover section 50 and is connected to an external component that is not shown in the drawings.

Although the electrical connection member 12 is illustrated as an electric wire having a terminal, the electrical connection member is not limited thereto, but may employ other components that can electrically connect the electric part 11a in the electrical junction box 1 to an external power supply.

The side cover section 40 slides along the groove part 10b on the box body from the upper side toward the lower side and is attached to the groove part.

Next, the upper cover section 30 will be described.

As shown in FIG. 2, the upper cover section 30 has a box shape whose bottom is opened, and is mounted to the box body 20 when a lower edge thereof covers an upper edge of the frame section 10.

Next, the side cover section 40 will be described.

As shown in FIGS. 1 to 4, the side cover section 40 has an engaging part 42 (see FIG. 3) for fixing the electrical connection member 12 to a planar base part 41 that serves as a main body part.

The engaging part 42 for the electrical connection member is provided on a surface 41a on the side where the planar base part 41 is attached to the box body 20. Thus, when the side cover section 40 is attached to cover a channel opening of the frame section 10, the connector 12a of the electrical connection member 12 is accommodated in the groove part 10b on the box body.

Next, the lower cover section 50 will be described in detail.

The lower cover section 50 has a box shape which has an opened upper surface, a bottom wall part 51, and a surrounding side wall part 52 which stands up from a circumference of the bottom wall part 51. The lower cover section is mounted to the frame section 10 when a circumference of an upper end thereof covers a circumference of a lower end of the frame section 10.

As shown in FIGS. 4 to 6, the lower cover section 50 has a water draining hole 53 on the bottom wall part 51a thereof. The bottom wall part 51a is formed as a centrally inclined surface so that the water draining hole 53 is located at a lower position of the bottom wall part 51a, that is, water flows towards the water draining hole 53.

An opening of the water draining hole 53 has a sectional shape that is defined by a line and a curve and is formed in the shape of the letter D.

The lower cover section 50 includes a waterproof wall 60 which is provided inside the box body along a periphery 53a of the opening of the water draining hole 53 as shown in FIGS. 5, 7, and 8, and a peripheral draining protrusion 90 which, as shown in FIGS. 6 to 8, is provided outside the box body as a draining passage through which water drains to the outside from the water draining hole 53.

The waterproof wall 60 includes a spherical cover wall part 70 which stands up from the periphery 53a of the opening of the water draining hole 53 to cover the water draining hole with an inner spherical surface 70a, and a draining opening part 80 which is formed at the spherical cover wall part 70.

The spherical cover wall part 70 is defined by a dome-type wall having the inner spherical surface 70a. That is, an outer surface that is opposite the inner spherical surface 70a is an outer spherical surface 70b that is curved at the inside of the lower cover section 50.

The whole of the inner spherical surface 70a of the spherical cover wall part 70 faces the water draining hole 53.

Further, the outer spherical surface 70b of the spherical cover wall part 70 allows water provided in the box body 20 to come into smooth contact with the spherical cover wall part 70.

The draining opening part 80 is formed on the spherical cover wall part 70 to allow water provided in the box body 20 to drain to the outside through the water draining hole 53 along the bottom wall part 51a.

An upper periphery 80a of the draining opening part 80 is located below the top of the inner spherical surface 70a. Thus, a downwardly protruding portion 71 of the spherical cover wall part 70 forms the upper periphery 80a of the draining opening part 80.

The peripheral draining protrusion 90 has a cylindrical shape that extends downwardly from an outer surface 50a of the lower cover section along the periphery 53a of the opening of the water draining hole. An outer surface 91 of the peripheral draining protrusion 90 is defined by a flat surface part 91a and a curved surface part 91b to correspond to the shape of the letter D of the water draining hole 53. Thus, when water collides with the curved surface part 91b of the peripheral draining protrusion 90, the water is difficult to stay around the curved surface part 91b.

As shown in FIG. 8, when water infiltrates strongly into the water draining hole 53, the water collides with the inner spherical surface 70a of the spherical cover wall part 70. The water colliding with the inner spherical surface 70a bounces towards the water draining hole 53. This is because most part of inner spherical surface 70a faces the water draining hole 53.

Further, when water infiltrates into the lower cover section 50 through the draining opening part 80, the water collides with the downwardly protruding portion 71, so that the water is difficult to infiltrate into the lower cover section 50 through the draining opening part 80.

In the electrical junction box 1 according to an illustrative embodiment of the invention, with the configuration of the spherical cover wall part 70 covering the water draining hole 53 in a spherical form from the inside of the electrical junction box, the whole of the inner spherical surface 70a thereof faces the water draining hole 53, so pressurized water infiltrating into the water draining hole 53 from the outside bounces back against the spherical surface 70a towards the water draining hole 53. Therefore, water bouncing against the waterproof wall 60, which is provided inside the water draining hole 53 along the periphery 53a thereof, is restricted from infiltrating from the water draining hole 53 into the electrical junction box 1.

In the electrical junction box 1 according to an illustrative embodiment of the invention, with the configuration of the peripheral draining protrusion 70 around the periphery 53a of the water draining hole 53, water is restricted from infiltrating into the water draining hole 53.

In the electrical junction box 1 according to an illustrative embodiment of the invention, with the configuration of the downwardly protruding portion 71 of the spherical cover wall part 70 forming the upper periphery 80a of the draining opening part 80 formed at the spherical cover wall part, water infiltrating into the box body 20 through the draining opening part 80 formed at the spherical cover wall part bounces against the downwardly protruding portion 71 of the spherical cover wall part 70 and thus is restricted from infiltrating into the box body 20.

In the electrical junction box 1 according to an illustrative embodiment of the invention, with the curved surface part 91b of the peripheral draining protrusion 90, it is difficult for water bouncing against the curved surface part 91b to stay around the curved surface part 91b, thereby preventing the water from infiltrating into the water draining hole 53.

In the electrical junction box 1 according to an illustrative embodiment of the invention, with the configuration of the outer spherical surface 70b of the spherical cover wall part 70 facing the inside of the box body 20, water provided inside the box body 20 comes into smooth contact with the spherical cover wall part 70 and thus is difficult to stay around the spherical cover wall part 70, thereby facilitating the drainage of the water in the box body 20 towards the outside through the water draining hole 53.

First Modified Embodiment

Figure 9:
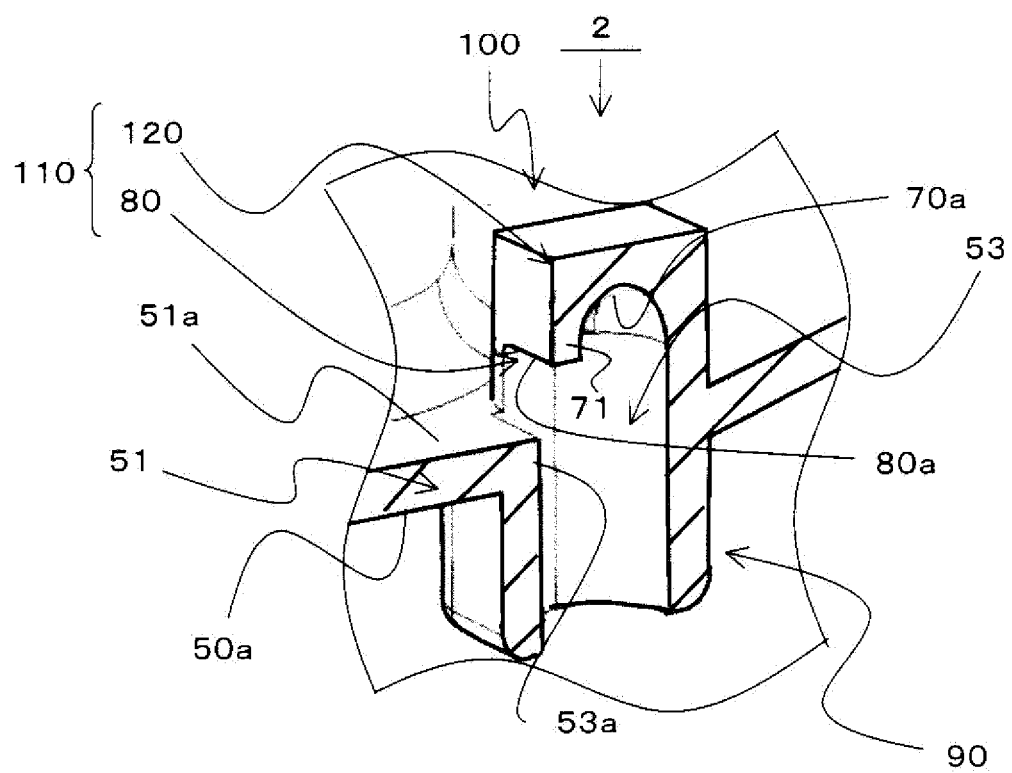
FIG. 9 is a sectional view of the major surroundings of a water draining hole of an electrical junction box according to a first modification of the embodiment of the present invention when obliquely viewed from an upper portion of the inside of a lower cover section.

Next, a first modified embodiment of the electrical junction box 1 according to the former embodiment of the present invention will be described with reference to FIG. 9. FIG. 9 is a sectional view of the major surroundings of a water draining hole 53 of an electrical junction box 2 according to the first modified embodiment of the former embodiment 1 of the present invention when obliquely viewed from an upper portion of the inside of a lower cover section 100.

The electrical junction box 2 of the first modified embodiment is different from the electrical junction box 1 of the former embodiment in that the lower cover section 100 includes a waterproof wall 110, instead of the waterproof wall 60, and a spherical cover wall part 120 is not a dome-type wall.

The other configuration is identical to that of the former embodiment, and like reference signs indicate like elements in the former embodiment.

The spherical cover wall part 120 stands up from a periphery 53a of an opening of the water draining hole 53 to cover the water draining hole 53 with an inner spherical surface 70a from the inside of the box body. An outer surface of the spherical cover wall part 110 that is opposite the inner spherical surface 70a is an outer flat surface, and the spherical cover wall part has a shape like a rectangular parallelepiped that protrudes towards the inside of the lower cover section 100.

In the electrical junction box 2 according to the first modified embodiment, like the electrical junction box 1 of the former embodiment, with the configuration of the spherical cover wall part 120 covering the water draining hole 53 in a spherical form from the inside of the box body, the whole of the inner spherical surface 70a thereof faces the water draining hole 53, so pressurized water infiltrating into the water draining hole 53 from the outside bounces back against the spherical surface 70a towards the water draining hole 53. Therefore, water bouncing against the waterproof wall, which is provided inside the water draining hole 53 along the periphery 53a thereof, is restricted from infiltrating into the water draining hole 53.

Second Modified Embodiment

Figure 10:
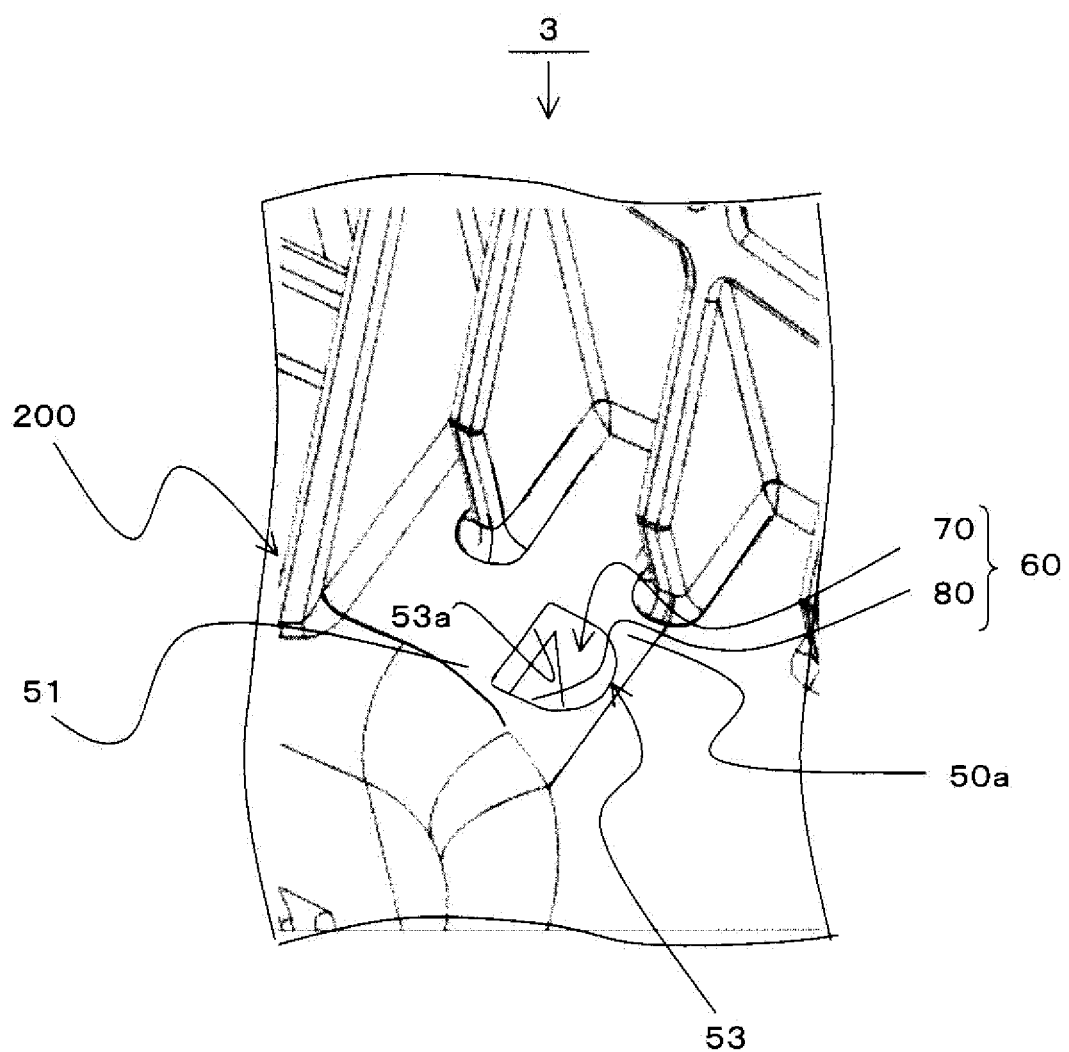
FIG. 10 is a view of the major surroundings of a water draining hole of an electrical junction box according to a second modification of the embodiment of the present invention when obliquely viewed from a lower side of a lower cover section.

Next, a second modified embodiment of the electrical junction box 1 according to the former embodiment of the present invention will be described with reference to FIG. 10. FIG. 10 is a view of the major surroundings of a water draining hole 53 of an electrical junction box 3 according to the second modified embodiment of the former embodiment 1 of the present invention when obliquely viewed from a lower side of a lower cover section 200.

The electrical junction box 3 of the second modified embodiment is different from the electrical junction box 1 of the former embodiment in that the lower cover section 200 does not includes the peripheral draining protrusion 90.

The other configuration is identical to that of the former embodiment, and like reference signs indicate like elements in the former embodiment.

In the electrical junction box 3 according to the second modified embodiment, like the electrical junction box 1 of the former embodiment, water bounces against the waterproof wall 60, which is provided inside the water draining hole 53 along the periphery 53a thereof, and thus is restricted from infiltrating into the water draining hole 53.

Although the embodiments of the invention have illustrated that the box body 20 of the electrical junction box 1, 2, or 3 includes the frame section 10 and the lower cover section 50, the invention is not limited to the embodiments. The box body may also include a combined section in which the frame section 10 and the lower cover section 50 are integrally formed.

Although the invention contrived by the inventors has been described in detail based on the above-mentioned illustrative embodiments, the invention is not limited thereto, and various modifications are possible, without departing from the scope and spirit of the invention.

What is claimed is:

1. An electrical junction box comprising:
   a box body in which electrical parts are mounted and that has a water draining hole provided at a bottom wall part of the box body;
   a waterproof wall that is provided inside the box body along a periphery of an opening of the water draining hole and includes:
   a spherical cover wall part standing from the periphery of the water draining hole to cover the water draining hole with an inner spherical surface; and
   a draining opening part formed at a portion of the spherical cover wall part to allow water exist in the box body to drain to the outside of the box body through the water draining hole.

2. The electrical junction box according to claim 1, wherein the box body includes a peripheral draining protrusion having a shape of a cylinder protruding from an outer surface of the box body along the periphery of the water draining hole and serving as a draining passage.

3. The electrical junction box according to claim 1, wherein an upper periphery of the draining opening part is located below the top of the inner spherical surface.

4. The electrical junction box according to claim 2, wherein the opening of the water draining hole is formed in a shape of the letter D, and
   the peripheral draining protrusion has an outer surface defined by a flat surface part and a curved surface part so as to correspond to the shape of the water draining hole.

5. The electrical junction box according to claim 1, wherein the spherical cover wall part is formed as a dome-type wall having a spherical surface.

* * * * *